United States Patent [19]
Barrow

[11] Patent Number: 6,146,921
[45] Date of Patent: *Nov. 14, 2000

[54] CAVITY MOLD CAP BGA PACKAGE WITH POST MOLD THERMALLY CONDUCTIVE EPOXY ATTACH HEAT SINK

[75] Inventor: Michael Barrow, El Dorado Hills, Calif.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/153,982

[22] Filed: Sep. 16, 1998

[51] Int. Cl.⁷ .................................................. H01L 31/107
[52] U.S. Cl. ...................... 438/122; 438/126; 438/127; 257/707; 257/706
[58] Field of Search .................... 257/796, 787, 257/706, 707; 438/126, 127, 122

[56] References Cited

U.S. PATENT DOCUMENTS

| 5,216,283 | 6/1993 | Lin ........................................... 257/796 |
| 5,444,909 | 8/1995 | Mehr . |
| 5,705,851 | 1/1998 | Mostafazadeh et al. ............... 257/796 |
| 5,719,442 | 2/1998 | Otsuki . |
| 5,773,886 | 6/1998 | Rostoker et al. . |

FOREIGN PATENT DOCUMENTS

| 63-240053 | 10/1988 | Japan ..................................... 257/796 |
| 5-211250 | 8/1993 | Japan .................................. 2157 796 |

Primary Examiner—Sheila V. Clark
Attorney, Agent, or Firm—Blakely, Sokoloff, Taylor & Zafman LLP

[57] ABSTRACT

An integrated circuit package which includes a thermal element that extends into a cavity of an injection molded housing. The cavity exposes at least a portion of an integrated circuit that is mounted to a substrate. The package includes an adhesive that attaches the thermal element to the housing and/or integrated circuit. The thermal element is assembled to the package after the housing has been molded onto the substrate and integrated circuit. Attaching the thermal element after the mold process can insure that the element is in direct thermal contact with the integrated circuit.

16 Claims, 1 Drawing Sheet

CAVITY MOLD CAP BGA PACKAGE WITH POST MOLD THERMALLY CONDUCTIVE EPOXY ATTACH HEAT SINK

BACKGROUND OF THE INVENTION

1. Field of the Invention

The present invention relates to an integrated circuit package.

2. Background Information

Integrated circuits are typically assembled into a package that is mounted to a printed circuit board. There are many types of integrated circuit packages including quad flat pack, pin grid array and plastic ball grid array (PBGA) packages. A PBGA package typically contains an integrated circuit which is mounted to a substrate. A plurality of solder balls are attached to a bottom surface of the substrate and reflowed to mount the package to a printed circuit board. The printed circuit board may be a motherboard of a computer system. The substrate may have routing traces and vias which connect the integrated circuit to the solder balls.

The integrated circuit of a PBGA package is enclosed by a protective plastic material. The outer plastic material is typically formed with an injection mold process. The integrated circuit generates heat which must be removed from the package. The plastic material has a relatively low coefficient of thermal conductivity which can create undesirable junction temperatures for the integrated circuit. A thermal element such as a heat slug may be integrated into the plastic housing to facilitate the removal of heat generated by the integrated circuit.

The heat slug is typically integrated into the package by placing the slug, integrated circuit and substrate into a plastic mold cavity. Plastic material is then injected into the mold cavity. The plastic cures and becomes attached to the substrate, integrated circuit and heat slug. It has been found that the plastic material may flow between the heat slug and the integrated circuit to create a layer of plastic between the two components. The plastic layer increases the thermal impedance between the integrated circuit and the heat slug. The increase in thermal impedance may raise the junction temperatures of the integrated circuit. It would be desirable to provide a package and a process that would eliminate the formation of plastic between the thermal element and the integrated circuit.

SUMMARY OF THE INVENTION

One embodiment of the present invention is an integrated circuit package which includes a thermal element that extends into a cavity of an injection molded housing. The cavity exposes at least a portion of an integrated circuit that is mounted to a substrate. The thermal element is thermally coupled to the integrated circuit. The package includes an adhesive that attaches the thermal element to the housing and/or integrated circuit.

DETAILED DESCRIPTION OF THE INVENTION

One embodiment of the present invention is an integrated circuit package which includes a thermal element that extends into a cavity of an injection molded housing. The cavity exposes at least a portion of an integrated circuit that is mounted to a substrate. The package includes an adhesive that attaches the thermal element to the housing and/or integrated circuit. The thermal element is assembled to the package after the housing has been molded onto the substrate and integrated circuit. Attaching the thermal element after the mold process can insure that the element is in direct thermal contact with the integrated circuit. This is to be distinguished from the prior art wherein the thermal element is integrated into the package during the mold process.

Figure 1:
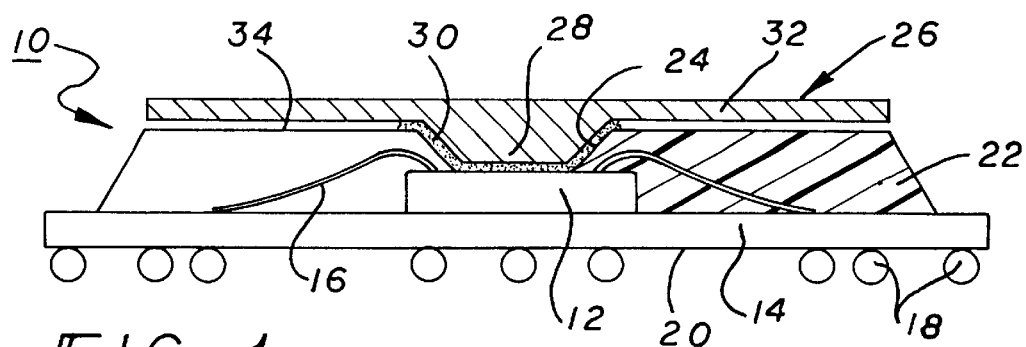
FIG. 1 is a side sectional view of an embodiment of an integrated circuit package of the present invention.

Referring to the drawings more particularly by reference numbers, FIG. 1 shows an embodiment of an integrated circuit package 10 of the present invention. The package 10 may include an integrated circuit 12 that is mounted to a substrate 14. The integrated circuit 12 may be electrically connected to the substrate 14 by a plurality of bond wires 16. Although bond wires 16 are shown and described, it is to be understood that the integrated circuit 12 may be connected to the substrate 14 by other means such as solder bumps utilized in a process commonly referred to as controlled collapsed chip connection (C4).

The package 10 may include a plurality of solder balls 18 that are attached to a bottom surface 20 of the substrate 14. The solder balls 18 may be reflowed to attach the package 10 to a printed circuit board (not shown). The substrate 14 may contain routing traces, surface pads, power/ground planes and vias, etc. which electrically connect the solder balls 18 to the bond wires 16. Although solder balls 18 are shown and described, it is to be understood that the package 10 may have other contacts such as pins.

The package 10 may have an injection molded housing 22 that is attached to the substrate 14. The housing 22 may have a cavity 24 that exposes a portion of the integrated circuit 12. The cavity 24 is formed during the molding process of the housing 22.

The integrated circuit 12 generates heat which must be removed from the package 10. To facilitate the removal of heat a thermal element 26 may be integrated into the package 10. The thermal element 26 may have a slug portion 28 that extends into the cavity 24. The slug portion 28 is in thermal contact with the integrated circuit 12. Thermal contact being generally defined as either direct contact between the integrated circuit 12 and slug portion 28, or the attachment of the slug 28 to the circuit 12 by a thermally conductive material such as a thermally conductive epoxy or thermal grease. The thermal element 26 may be constructed from a thermally conductive material such as copper or aluminum.

The package 10 may include an adhesive 30 that attaches the thermal element 26 to the housing 22 and/or integrated circuit 12. The adhesive 30 may be a thermally conductive epoxy that is applied to the thermal element 26, housing 22 and/or integrated circuit 12 before the slug portion 28 is inserted into the cavity 24. The adhesive 30 can be applied to the entire interface between the thermal element 26 and housing 22 and/or the interface between the thermal element 26 and the integrated circuit 12. The adhesive 30 may attach the element 26 to the housing 22 and seal the integrated circuit 12.

Figure 2:
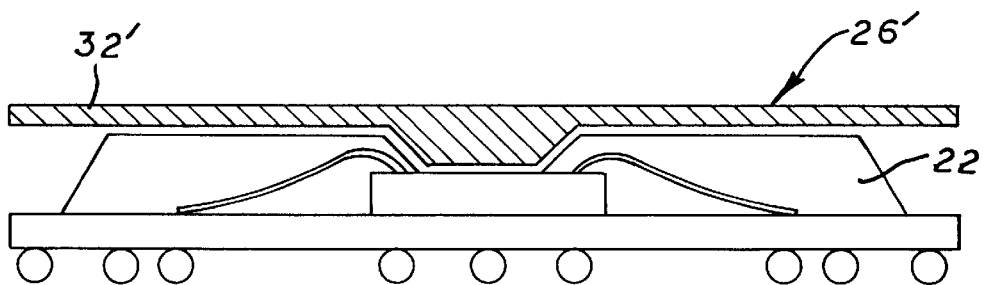
FIG. 2 is an alternate embodiment of the package.
Figure 3:
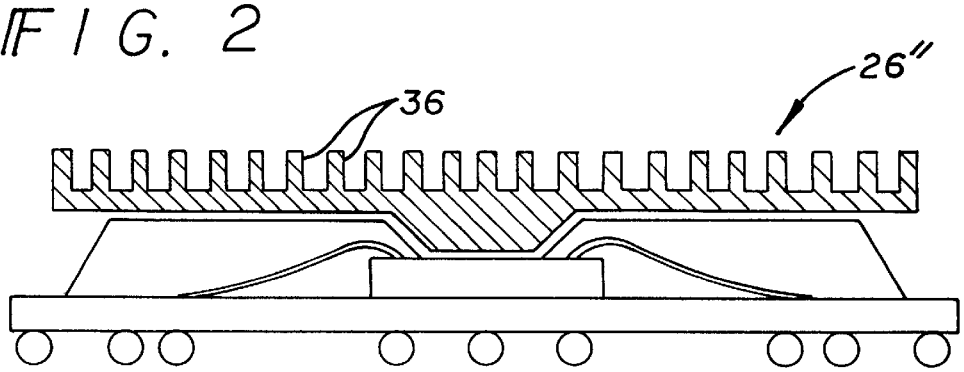
FIG. 3 is an alternate embodiment of the package.

The thermal element 26 may have a plate portion 32 that extends across a top surface 34 of the housing 22. The plate portion 32 provides additional area to increase the heat transfer rate from the package. FIG. 2 shows an alternate embodiment of a thermal element 26' which has a plate portion 32' that is larger than the housing 22. FIG. 3 shows another alternate thermal element 26" embodiment which has a plurality of fins 36. The fins 36 increase the effective heat transfer area of the element 26".

Figure 4:
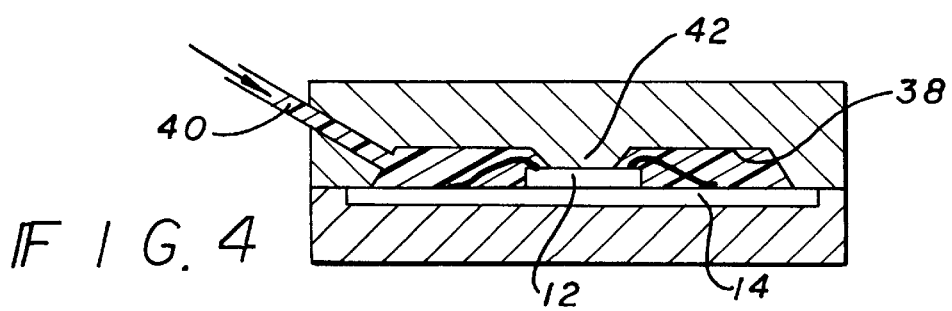
FIG. 4 is a side sectional view showing an integrated circuit and substrate within a mold cavity.

The package 10 can be assembled by initially mounting and connecting the integrated circuit 12 to the substrate 14 and placing the circuit/substrate subassembly in a mold cavity 38 as shown in FIG. 4. A plastic material 40 is injected into the mold cavity 38.

The mold cavity 38 may have a die portion 42 that forms the housing cavity and is in contact with the integrated circuit 12 so that plastic material cannot flow across the entire surface of the circuit 12. The plastic is cured and removed from the mold. The thermal element can then be attached to the housing 22 and/or integrated circuit 12 with the adhesive 30. The adhesive material 30 may be applied with an applicator (not shown) that dispenses material 30 into the housing cavity. The solder balls 18 can be attached to the substrate 14 to complete the package 10.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method for assembling an integrated circuit package, comprising:

mounting an integrated circuit onto a substrate;

molding a housing onto the substrate, the housing includes a cavity that exposes at least a portion of the integrated circuit to prevent a corresponding portion of the housing from covering the portion of the integrated circuit;

inserting a thermal element into the cavity after molding of the housing, the thermal element includes a plate portion extending across an adjacent portion of the housing and beyond the housing; and, establishing a thermal contact between the thermal element and the integrated circuit.

2. The method as recited in claim 1, further comprising attaching the thermal element to the housing.

3. The method as recited in claim 1, wherein the establishing of the thermal contact comprises attaching the thermal element to the integrated circuit using a thermally conductive material.

4. The method as recited in claim 1, wherein the establishing of the thermal contact comprises attaching the thermal element directly to the integrated circuit.

5. The method as recited in claim 1, wherein the molding of the housing is performed through injection molding.

6. The method as recited in claim 1, wherein the thermal element includes a slug portion coupled to the integrated circuit.

7. A method comprising:

placing an integrated circuit on a substrate;

forming a housing for the integrated circuit on the substrate, the housing including a cavity to expose a portion of the integrated circuit and prevent the housing from covering the portion if the integrated circuit;

inserting a thermal element into the cavity thermal element including a plate portion extending across an adjacent portion of housing and beyond the housing;

establishing a thermal contact between the thermal element and the portion of the integrated circuit after the housing has been formed.

8. The method as recited in claim 7, wherein the establishing of the thermal contact comprises attaching the thermal element to the portion of the integrated circuit using a thermally conductive material.

9. The method as recited in claim 7, wherein the establishing of the thermal contact comprises attaching the thermal element directly to the portion of the integrated circuit.

10. The method as recited in claim 7, wherein the forming of the housing is performed through injection molding.

11. The method as recited in claim 7, wherein the thermal element includes a slug portion coupled to the integrated circuit.

12. A method comprising:

forming a housing for an integrated circuit, using injection molding, the housing including a cavity to expose a portion of the integrated circuit and prevent the housing from covering the portion of the integrated circuit;

inserting a thermal element into the cavity, the thermal element including plate portion extending across an adjacent portion of the housing and beyond the housing:

establishing a thermal contact between the thermal element and the portion of the integrated circuit after injecting molding to form the housing.

13. The method as recited in claim 12, further comprising attaching the thermal element to the housing.

14. The method as recited in claim 12, wherein the establishing of the thermal contact comprises attaching the thermal element to the portion of the integrated circuit using a thermally conductive material.

15. The method as recited in claim 12, wherein the establishing of the thermal contact comprises attaching the thermal element directly to the portion of the integrated circuit.

16. The method as recited in claim 12, wherein the thermal element includes a slug portion coupled to the integrated circuit.

\* \* \* \* \*